United States Patent
Yasuda et al.

(10) Patent No.: US 7,919,750 B2
(45) Date of Patent: Apr. 5, 2011

(54) ELECTRON GUN, ELECTRON BEAM EXPOSURE APPARATUS, AND EXPOSURE METHOD

(75) Inventors: Hiroshi Yasuda, Tokyo (JP); Takeshi Haraguchi, Tokyo (JP); Yoshihisa Ooae, Tokyo (JP); Takamasa Satoh, Tokyo (JP); Yoshinori Terui, Shibukawa (JP); Seiichi Sakawa, Shibukawa (JP); Ryozo Nonogaki, Shibukawa (JP)

(73) Assignees: Advantest Corporation, Tokyo (JP); Denki Kagaku Kogyo Kabushiki Kaisha, Tokyo (JP)

( * ) Notice: Subject to any disclaimer, the term of this patent is extended or adjusted under 35 U.S.C. 154(b) by 330 days.

(21) Appl. No.: 12/151,500

(22) Filed: May 7, 2008

(65) Prior Publication Data

US 2008/0315089 A1    Dec. 25, 2008

Related U.S. Application Data

(63) Continuation of application No. PCT/JP2006/321991, filed on Nov. 2, 2006.

(30) Foreign Application Priority Data

Nov. 8, 2005    (JP) .................. 2005-323673

(51) Int. Cl.
    *H01J 29/48*    (2006.01)
    *H01J 37/073*   (2006.01)
(52) U.S. Cl. ...... 250/310; 250/306; 250/307; 250/396 R; 250/492.3; 315/111.81; 313/414; 313/413
(58) Field of Classification Search .................. 250/306, 250/310, 307, 396 R, 492.3; 315/111.81; 313/413, 414
    See application file for complete search history.

(56) References Cited

U.S. PATENT DOCUMENTS

| 6,252,344 | B1 * | 6/2001 | Ooae et al. ..................... 313/413 |
| 6,583,413 | B1 * | 6/2003 | Shinada et al. ................... 850/9 |
| 7,098,455 | B2 * | 8/2006 | Shinada et al. ............... 250/310 |
| 2008/0211376 | A1 * | 9/2008 | Yasuda et al. ................. 313/414 |
| 2010/0019648 | A1 * | 1/2010 | Yasuda et al. ................. 313/412 |

FOREIGN PATENT DOCUMENTS

| JP | 08-184699 | 7/1996 |
| JP | 09-169518 | 6/1997 |
| JP | 09-283068 | 10/1997 |
| JP | 10-321120 | 12/1998 |
| JP | 2001-325910 | 11/2001 |
| JP | 2003-100244 | 4/2003 |
| JP | 2005-063857 | 3/2005 |
| JP | 2005-183335 | 7/2005 |
| JP | 2005-190758 | 7/2005 |

\* cited by examiner

*Primary Examiner* — Nikita Wells
(74) *Attorney, Agent, or Firm* — Muramatsu & Associates

(57) ABSTRACT

An electron gun includes an electron source configured to emit electrons. The electron source includes an electron emission region configured to emit the electrons and an electron emission restrictive region configured to restrict emission of the electrons. The electron emission restrictive region is located on a side surface of the electron source except an electron emission surface on a tip of the electron source and is covered with a different material from the electron source. The electron gun emits thermal field-emitted electrons by applying an electric field to the tip while maintaining a sufficiently low temperature to avoid sublimation of a material of the electron source. The material of the electron source may be lanthanum hexaboride ($LaB_6$) or cerium hexaboride ($CeB_6$). The electron emission restrictive region may be covered with carbon.

16 Claims, 7 Drawing Sheets

US 7,919,750 B2

ELECTRON GUN, ELECTRON BEAM EXPOSURE APPARATUS, AND EXPOSURE METHOD

CROSS-REFERENCE TO RELATED APPLICATIONS

This application is a continuation of prior International Patent Application No. PCT/JP2006/321991, filed Nov. 2, 2006, the entire contents of which are incorporated herein by reference.

BACKGROUND OF THE INVENTION

1. Field of the Invention

The present invention relates to an electron gun used in a lithography process for manufacturing a semiconductor device, an electron beam exposure apparatus provided with the electron gun, and to an exposure method.

2. Description of the Prior Art

In order to enhance throughput, a recent electron beam exposure apparatus is provided with a mask having a variable rectangular aperture formed therein, or with multiple mask patterns. One of the mask patterns is firstly selected by means of beam deflection, and the selected pattern is then transferred onto a wafer through exposure. An exposure method employing the above-mentioned multiple mask patterns is achieved by an electron beam exposure device that is configured to perform block exposure. In the block exposure, patterns are transferred onto a sample surface by the following procedures. Specifically, a beam is irradiated on a pattern region selected from multiple patterns disposed on a mask by means of beam deflection so that a cross section of the beam is formed into a shape of the pattern. Furthermore, the beam that has passed through the mask is deflected back by a deflector located on a later stage and is transferred onto the sample surface after the scale of the pattern is reduced to a certain reduction ratio which is determined by an electron optical system.

Incidentally, ensuring linewidth accuracy is also an important factor for the above-mentioned type of exposure apparatus in order to enhance throughput. To ensure linewidth accuracy, intensity of an electron beam emitted from an electron gun must not be changed over time. In a case where the intensity of the electron beam is weakened due to the change over time, the degree of exposure is gradually reduced. An increase in exposure time to supplement the weakened electron beam due to the change over time may lead not only to complication of control but also to deterioration in the throughput.

In general, methods of emitting electrons from an electron gun are classified broadly into a thermal electron emission type method and a field emission type method. The thermal electron emission type electron gun includes a cathode configured to emit electrons by heating, a Wehnelt cylinder configured to generate an electron beam flux with converging the electrons emitted from the cathode, and an anode configured to accelerate the converged electron beam.

With the use of the above-described thermal electron emission type electron gun, a material constituting an electron source (a chip) used in the electron gun loses its quantity by sublimation or evaporation along with the emission of the electrons. Accordingly, a phenomenon of deformation of an electron emitter occurs. Various countermeasures have been studied to prevent the above-mentioned phenomenon. For example, Japanese Patent Application Publication No. Hei 8-184699 discloses an electron gun in which a chip is covered by a two-layer structure consisting of tungsten (W) and rhenium (Re) to suppress depletion of a chip.

As described above, with the use of the thermal electron emission type electron gun, not only the chip that constitutes the electron gun may emit the electrons but also the materials themselves constituting a chip may sublimate in some cases. The above mentioned sublimation of a chip is considered to occur because the temperature is heated up to the extent equal to or higher than the sublimation start temperature of the electron generating material.

Due to this sublimation, the shape of the chip for emitting the electrons is changed. Accordingly, such deformation prevents uniform irradiation of a variable rectangular beam or a block pattern beam, which causes the intensity reduction of the emitted electron beam. For example, with the use of a thermal electron emission type electron gun constituting a chip made of lanthanum hexaboride ($LaB_6$), at a temperature equal to 1500° C., the chip sublimates in an amount of 10 µm in one month.

Moreover, the chip material such as $LaB_6$ or cerium hexaboride ($CeB_6$) is attached to a rear surface of a grid as a result of the above-mentioned sublimation. The attached material may grow to a whisker. Then with the charged electrons thereon, a micro discharge may occur. Occurrence of this micro discharge may cause instabilities of the electron beam quantity and of a radiating position, thereby making it impossible to properly use an electron beam exposure apparatus. Moreover, the throughput may be deteriorated due to the time consumption for adjustment or other operations. The most serious problem is that the pattern drawn during the occurrence of the micro discharge may lead a loss of reliability. Therefore, the eradication of the micro discharge around the electron gun is indispensable to establish a high reliability of the electron beam exposure apparatus. In other words, the reduction in quantity of the material sublimation for the electron gun is the indispensable factor for the development to establish a high reliability as well as a high stability.

Although Japanese Patent Application Publication No. Hei 8-184699, discloses the technique to suppress depletion of the chip by covering the surface of the chip with the two-layer structure made of tungsten (W) and rhenium (Re), this technique is unable to prevent the change in the shape of a chip attributable to sublimation of an electron emission surface not covered with the two-layer structure.

SUMMARY OF THE INVENTION

The present invention has been made in view of the aforementioned problem of the conventional technology. An object of the present invention is to provide an electron gun which is capable of reducing a quantity of sublimation attributable to heat from an electron source for emitting electrons and thereby allowing stable use for a longer period of time, and to provide an electron beam exposure apparatus and an exposure method using this electron gun.

The above-described problem is solved by an electron gun including an electron source configured to emit electrons, in which the electron source includes an electron emission region configured to emit the electrons and an electron emission restrictive region configured to restrict emission of the electrons. Here, the electron emission restrictive region is located on a side surface of the electron source except an electron emission surface on a tip of the electron source and is covered with a material different from the electron source. Moreover, thermal field-emitted electrons are emitted through application of an electric field to the tip with a sufficiently low temperature being maintained to avoid sublimation of a material of the electron source.

In the electron gun of this aspect, the material of the electron source may be any one of lanthanum hexaboride ($LaB_6$) and cerium hexaboride ($CeB_6$). Meanwhile, the electron emission restrictive region may be covered with carbon. Here, the temperature may be set in a range from 1100° C. to 1300° C.

Moreover, in the electron gun of this aspect, the electron emission restrictive region may be defined as a region including a rear surface and the side surface of the electron source except the electron emission surface and a part sandwiched by a carbon chip used for heating by energization.

In the present invention, only the electron emission surface at the tip of a chip as an electron generating material is exposed while the remaining side surface part is covered with the different material. When $LaB_6$ is applied to the electron generating material, the different material is carbon (C), for example. Since the electron gun is operated at a low temperature, the chip hardly sublimates. In this way, the electron gun can be used stably for a long period of time while avoiding deformation of the electron emission surface. Moreover, as the side surface of the chip is covered with carbon, no electrons are emitted from the side surface of the chip even if an intense electric field is applied. Accordingly, a change in the shape of an electron beam can be avoided and a phenomenon of degradation in vacuum attributable to a rise in temperature of an unwanted part can be prevented. Not only the side surface is covered, but also the entire chip is preferably covered except the electron emission part on the tip with a protective film. This configuration is effective, not in terms of the electron emission, but in terms for suppressing sublimation and reducing an amount of an attached material onto a Wehnelt cylinder.

Meanwhile, the above-described problem is solved by an exposure method applying an electron gun provided with an electron source configured to emit electrons, an extraction electrode located at a given distance away from an electron emission surface of the electron source and configured to extract the electrons, a suppressor electrode located above the extraction electrode and the electron emission surface and configured to suppress emission of the electrons from a side surface of the electron source, and an acceleration electrode located below the extraction electrode and configured to accelerate the electrons. The electron gun is configured to emit thermal field-emitted electrons by applying an electric field to a tip of the electron source while maintaining a sufficiently low temperature to avoid sublimation of a material of the electron source, and then to render a sample exposed to the thermal field-emitted electrons. Here, the method includes the steps applying the voltage for a given time period so as to render electric potential at the extraction electrode lower than electric potential at the tip of the electron source, and performing exposure by applying the voltage so as to render the electric potential at the extraction electrode higher than electric potential at the tip of the electron source.

In the present invention, the electric potential at the extraction electrode is set lower than the electric potential at the electron source prior to performing the exposure. In this way, no electrons are extracted from the electron source. Accordingly, the electron source can be prevented from melting or breakage when conditioning is carried out.

DESCRIPTION OF THE PREFERRED EMBODIMENTS

Now, embodiments of the present invention will be described below with reference to the accompanying drawings.

First, a configuration of an electron beam exposure apparatus will be described. Subsequently, a configuration of an electron gun will be described and then a configuration of an electron source in the electron gun, which constitutes a characteristic part of the present invention, will be described. Next, an exposure method for an exposure apparatus applying the electron gun of the present invention will be described. Then, a method of forming a region for controlling electron emission on a surface of the electron source will be described. Lastly, effects of using the electron gun of the embodiment of the present invention will be described.
(Configuration of Electron Beam Exposure Apparatus)

Figure 1:
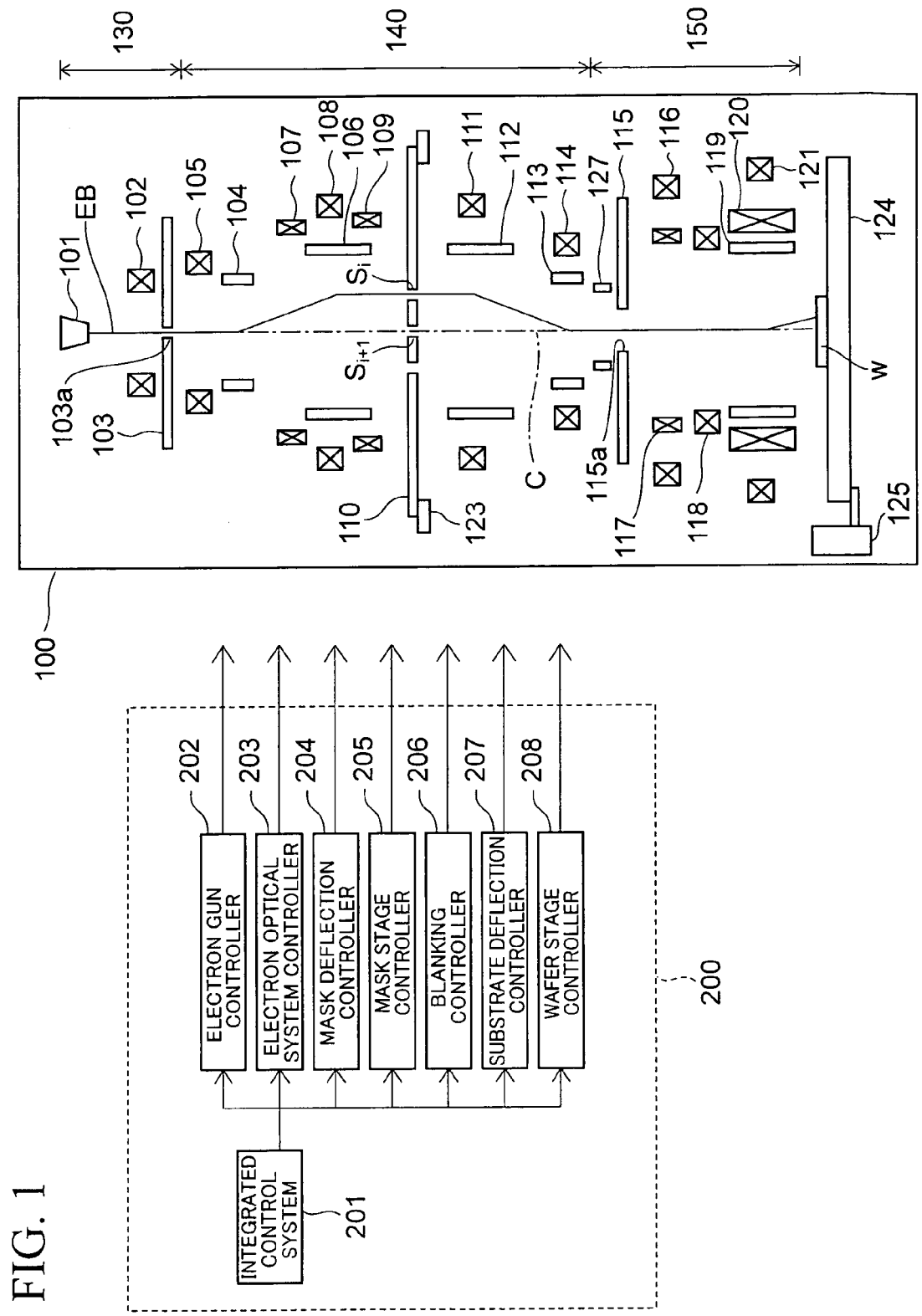
FIG. 1 is a block diagram of an electron beam exposure apparatus according to the present invention.

FIG. 1 is a block diagram of an electron beam exposure apparatus according to an embodiment of the present invention.

The electron beam exposure apparatus is broadly divided into an electron optical column 100 and a controller 200 for controlling respective units of the electron optical column 100. Here, the electron optical column 100 includes an electron beam generator 130, a mask deflector 140, and a substrate deflector 150. Pressure inside the electron optical column 100 is reduced.

In the electron beam generator 130, an electron beam EB generated from an electron gun 101 is subjected to a converging action by a first electromagnetic lens 102 and is then passed through a rectangular aperture 103a of a beam forming mask 103. Accordingly, a cross-section of the electron beam EB is formed into a rectangle.

Then, the electron beam EB is imageformed on an exposure mask 110 by use of a second electromagnetic lens 105 of the mask deflector 140. Then, the electron beam EB is deflected into a specific pattern Si formed on the exposure mask 110 by use of first electrostatic deflectors 104 and second electrostatic deflectors 106, whereby a cross-sectional shape thereof is formed into the shape of the pattern Si.

Here, the exposure mask 110 is fixed on a mask stage 123. The mask stage 123 is movable on a horizontal plane. When using a pattern S located outside deflections range (beam deflection ranges) of the first electrostatic deflectors 104 and the second electrostatic deflectors 106, the pattern S is moved inside the beam deflection ranges by shifting the mask stage 123.

Third electromagnetic lenses 108 and fourth electromagnetic lenses 111 located above and below the exposure mask 110 have a function to imageform the electron beam EB on a substrate W by adjusting the amounts of current applied thereto.

The electron beam EB passed through the exposure mask 110 is deflected back to an optical axis C by deflection operation attributable to third electrostatic deflectors 112 and fourth electrostatic deflectors 113. Then, the size of the electron beam EB is reduced by use of a fifth electromagnetic lens 114.

The mask deflector 140 is provided with first correction coils 107 and second correction coils 109. Beam deflection aberration caused by the first to fourth electrostatic deflectors 104, 106, 112, and 113 is corrected by the first correction coils 107 and second correction coils 109.

Thereafter, the electron beam EB is passed through an aperture 115a of a closure plate 115 constituting the substrate deflector 150, and is projected onto the substrate W by use of first projection electromagnetic lenses 116 and second projection electromagnetic lenses 121. In this way, an image of the pattern on the exposure mask 110 is transferred to the substrate W at a given reduction ratio such as 1/10.

The substrate deflector 150 is provided with a fifth electrostatic deflector 119 and an electromagnetic deflector 120. The electron beam EB is deflected by these deflectors 119 and 120 so that the image of the pattern on the exposure mask 110 is projected onto a given position on the substrate W.

Furthermore, the substrate deflector 150 is provided with third correction coils 117 and fourth correction coils 118 for correcting deflection aberration of the electron beam EB on the substrate W.

The substrate W is fixed on a wafer stage 124 which is horizontally movable by a drive 125 such as a motor. Accordingly, exposure on the entire surface of the substrate W can be performed by shifting the wafer stage 124.

Meanwhile, the controller 200 includes an electron gun controller 202, an electron optical system controller 203, a mask deflection controller 204, a mask stage controller 205, a blanking controller 206, a substrate deflection controller 207, and a wafer stage controller 208. Among these controllers, the electron gun controller 202 controls an acceleration voltage of the electron beam EB, beam emission conditions, or the like by controlling the electron gun 101. In the meantime, the electron optical system controller 203 controls amounts of current applied to the electromagnetic lenses 102, 105, 108, 111, 114, 116, and 121, and thereby adjusting a magnification, a focal position, and other parameters of the electron optical system configured by these electromagnetic lenses. The blanking controller 206 deflects the electron beam EB generated prior to start of exposure onto the closure plate 115 by controlling a voltage applied to a blanking electrode 127, and thereby preventing the irradiation of the electron beam EB onto the substrate before starting the exposure.

The substrate deflection controller 207 deflects the electron beam EB to the given position on the wafer W by controlling a voltage applied to the fifth deflector 119 and an amount of current applied to the electromagnetic deflector 120. The wafer stage controller 208 shifts the substrate W in the horizontal direction by adjusting a driving amount of the drive 125 so as to irradiate the electron beam EB onto the desired position on the substrate W. The respective constituents 202 to 208 described above are integrally controlled by an integrated control system 201 such as a workstation.

(Configuration of Electron Gun)

Figure 2:
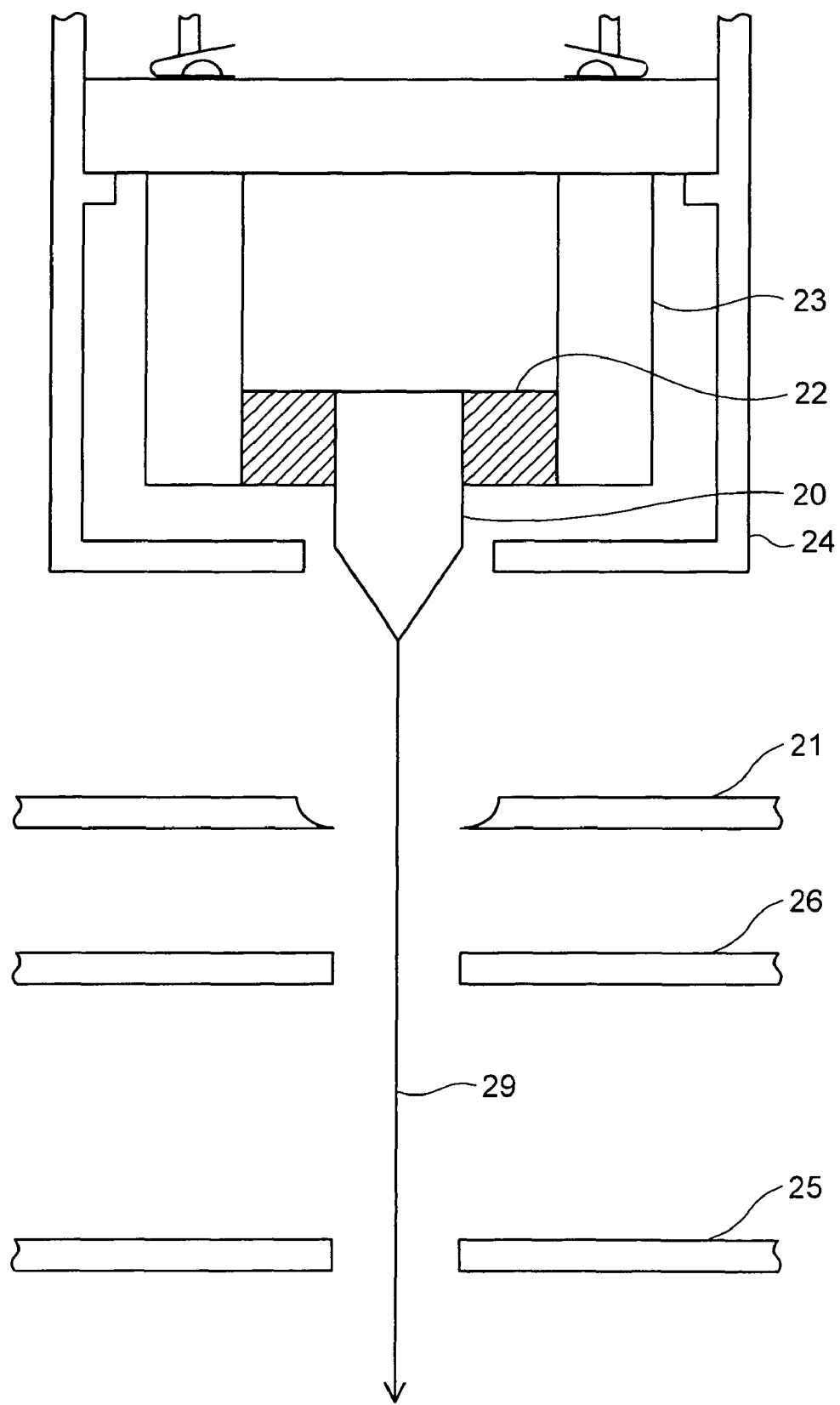
FIG. 2 is a block diagram of an electron gun according to the present invention.

FIG. 2 is a block diagram of the electron gun 101. In the embodiment of the present invention, the electron gun 101 applied is a thermal electric field emission type. The electron gun 101 includes an electron source 20, an extraction electrode 21, a heat generator 22 for heating the electron source which is made of carbon and located on both sides of the electron source 20, a holder 23 for holding the electron source 20 and the heat generator 22 for heating the electron source, and a suppressor electrode 24 for holding and surrounding the holder 23. The electron source applied is a single crystal of $LaB_6$ or $CeB_6$, for example.

In the electron gun 101 thus configured, the electron gun controller 202 heats the electron source 20 up to 1300° C. by continuously applying an electron source heating current to the heat generator 22 for heating the electron source. Then, the electron gun controller applies an intense electric field into a space between the suppressor electrode 24 and the extraction electrode 21 while maintaining the electron source 20 to a constant temperature, thereby extracting electrons from the electron source 20. Moreover, the electron gun controller 20 applies a voltage to an acceleration electrode 25 located below the extraction electrode 21 to extract an electron beam 29 holding a predetermined energy. Then, the electron beam 29 is irradiated on the photoresist coated substrate W fixed onto the wafer stage 124 so as to effectuate electron beam exposure.

Here, the voltage to be applied to the suppressor electrode 24 is set in a range from −0.1 to −0.5 kV while the voltage to be applied to the extraction electrode 21 is set in a range from 3.0 to 6.0 kV. These voltages are set to the values corresponding to electric potential at the electron source 20, which is adjusted by adding −50 kV because the electron source 20 usually has the electric potential at −50 kV relative to true earth ground.

In the embodiment of the present invention, the electrons are emitted by heating the electron source 20 and applying the intense electric field thereto at the same time. Accordingly, absorption of gas molecules on the surface of the electron source 20 can be avoided, and eventually deterioration in luminance of the electron beam can be avoided as well.

The disposition of an electrostatic lens electrode 26 in the space between the extraction electrode 21 and the acceleration electrode 25 is also conceivable in addition to the above-described electrodes.

The above-mentioned electrostatic lens electrode 26 is configured to adjust an opening angle of the electronic irradiation irradiated from the electron source 20 and to apply a voltage so as to avoid irradiation of the electrons onto the acceleration electrode 25.

Figure 3:
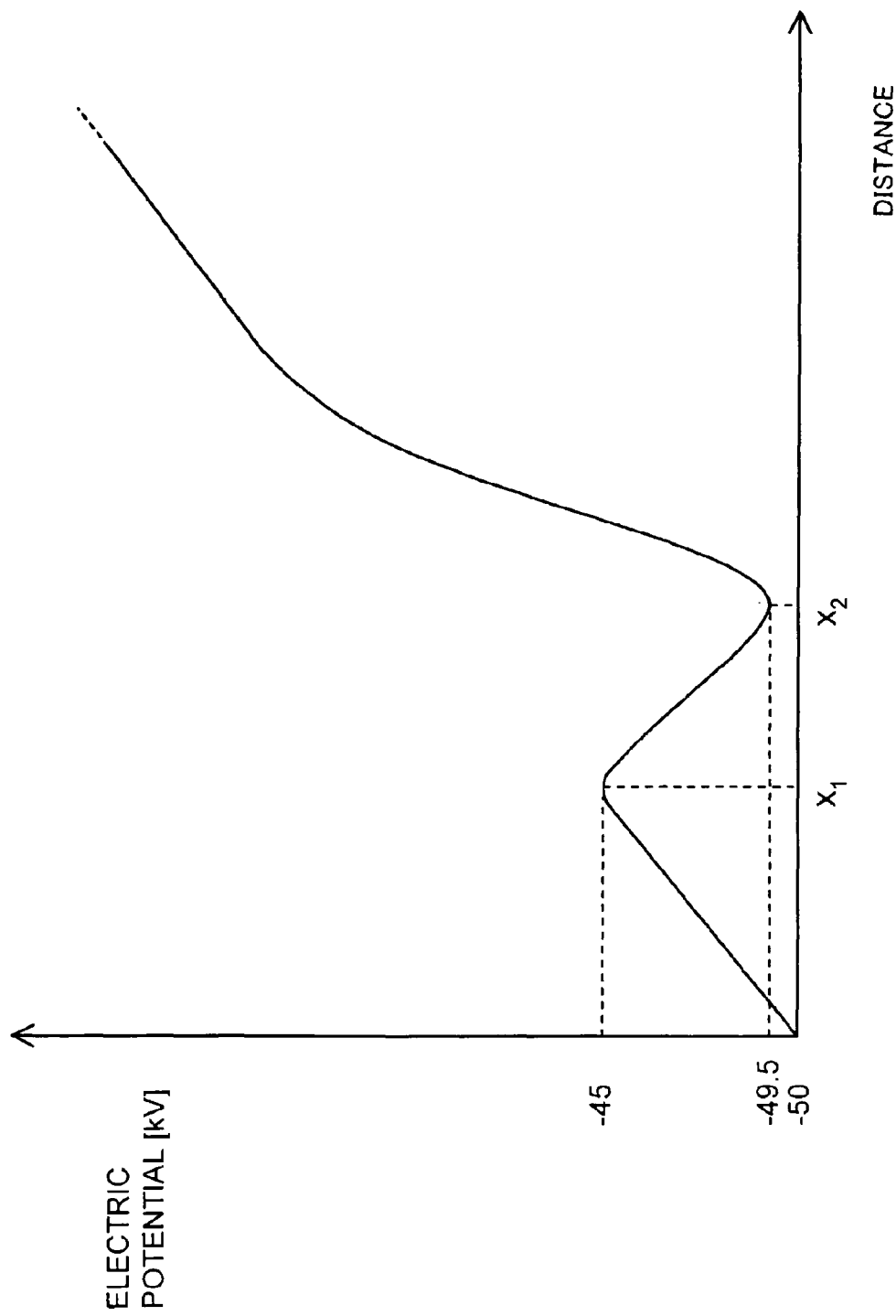
FIG. 3 is a chart showing an example of electric field intensity distribution of the electron gun according to the present invention.

FIG. 3 is a chart showing an example of electric field intensity distribution. In FIG. 3, the horizontal axis indicates the distance between the electron source and an electron emission surface. The vertical axis indicates the electric potential. In FIG. 3, x1 indicates the position of the extraction electrode 21 and x2 indicates the position of the electrostatic lens electrode 26. Moreover, FIG. 3 shows a case where the electric potential at the acceleration electrode 25 is set equal to 0 [kV] and the electric potential on the electron emission surface of the electron source 20 is set equal to −50 [kV].

As shown in FIG. 3, by forming an electron lens bearing the voltage slightly higher than a cathode voltage on the electron emission surface in the position of the electrostatic lens electrode 26, the opening angle of the irradiated electrons is reduced thereby. In this way, the electron exposure on the acceleration electrode 25 is avoided. As a consequence, heat generation attributable to irradiation of the electron beam onto the acceleration electrode 25 is eliminated, and degradation in vacuum inside the exposure apparatus is also controlled.

(Configuration of Electron Source)

Now, a configuration of the electron source 20 used in the embodiment in the present invention will be described below.

Figure 4:
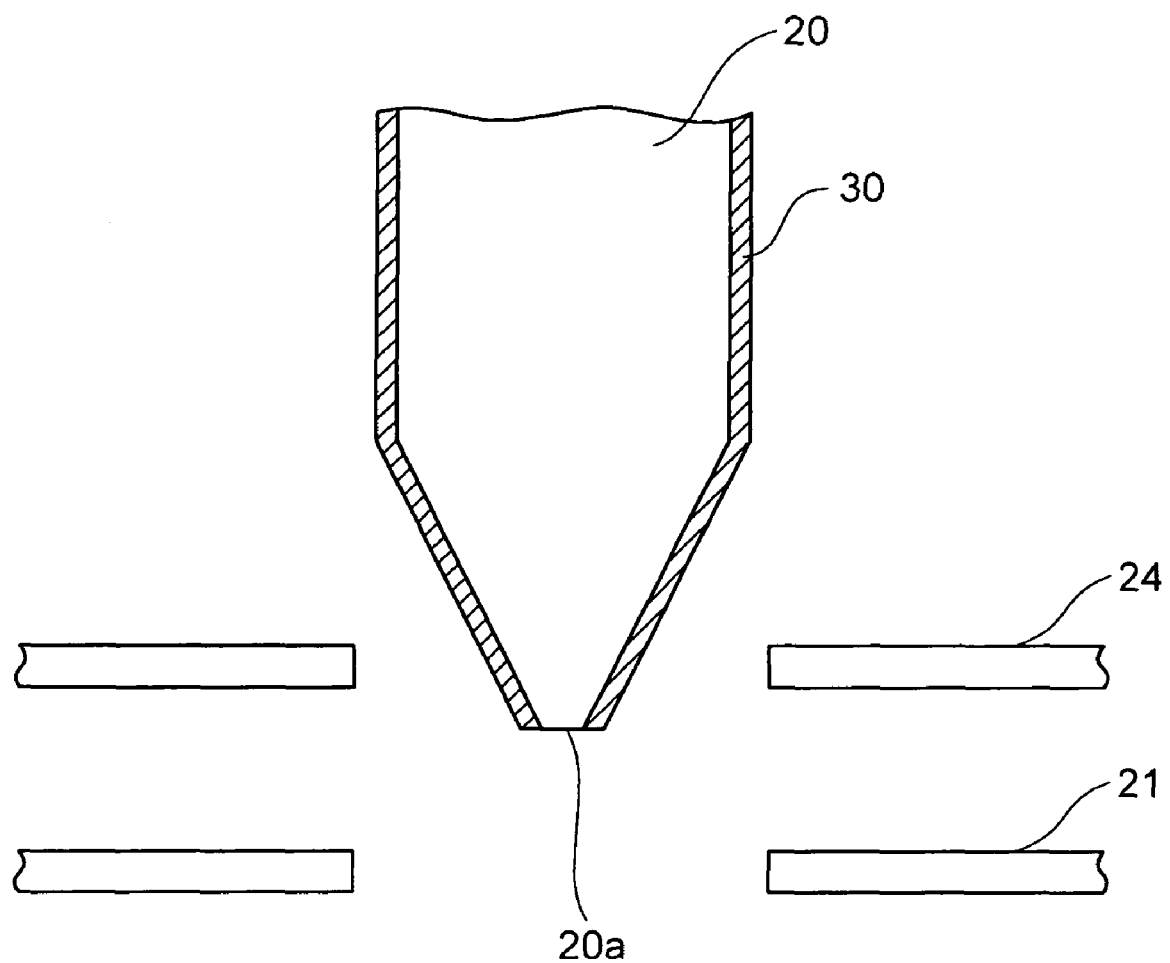
FIG. 4 is a block diagram of an electron source and electrodes constituting the electron gun shown in FIG. 2.

FIG. 4 is a cross-sectional diagram showing part of the electron source 20 and the electrodes which are both constitutions of the electron gun 101.

A tip of the electron source 20 is formed into a cone shape and a surrounding area is covered with carbon 30. This carbon 30 is formed on a surface of the electron source 20 in accordance with the chemical vapor deposition (CVD) method, for example. The material of the electron source 20 is exposed on the tip of the electron source 20 and the exposed part is planarized.

The tip of the electron source 20 is located in a position between the suppressor electrode 24 and the extraction electrode 21. A voltage equal to 0 or a negative value is applied to the suppressor electrode 24, so that the suppressor electrode 24 functions to block the electrons emitted from parts other than the tip of the electron source 20. The electric field intensity is determined by the following factors; a voltage difference between the extraction electrode 21 and the suppressor electrode 24, a height and an angle of the tip of the electron source 20, and a diameter of the planarized part of the tip. The planarized part at the tip of the electron source 20 is arranged parallel to the suppressor electrode 24 and the extraction electrode 21.

The tip of the electron source 20 is formed into a cone shape, and the electron emission surface 20a for emitting the electrons is planarized. The surrounding area of the cone-shaped electron source 20 is covered with a material which is different from the material consisting of the electron source 20. The cone-shaped part preferably has a cone angle equal to or below 50°. The diameter of the electron emission surface is set preferably in a range from 10 µm to 100 µm. Usually, the diameter is preferably set to 40 µm. Meanwhile, a thickness of the material covering the surrounding area of the electron source 20 is preferably set equal to 10 µm. Note that the covering with the different material have following two objectives; (1) to avoid emission of the electrons from the electron source 20 and (2) to suppress sublimation and evaporation of the material at a base body of the electron source 20. The thickness value of the covering material depends on the electric field intensity and the material used therein. The thinner covering material is preferable in light of increasing the electric field intensity as long as less covering material evaporates or is depleted at an operating temperature.

The temperature applied to the electron source 20 is set lower than a temperature causing sublimation of the material constituting the electron source 20. In case that a high temperature is applied to the electron source 20 to emit thermal electrons, the electron source 20 may sublimate so that the electron emission surface 20a is depleted and deformed. From this point of view, the temperature is regulated to an appropriate level so as not to cause the sublimation. Even when lowering the temperature, the current density and luminance are required to achieve the equivalent levels to those obtained in the case of applying the high temperature. For this reason, the intense electric field is applied to the tip of the electron source 20 so as to extract the electrons. For example, in case that a work function can be reduced by 0.3 eV when lowering the temperature from 1500° C. to 1300° C., then the electron beam luminance equivalent to the luminance that is supposed to be obtained by thermal electron emission can be obtained while maintaining the temperature at 1500° C. In this context, the high electric field is applied to the electron source 20 for causing emission of the electrons even when reducing the work function by 0.3 eV.

In this case, application of the high electric field causes extraction of the electrons not only from the tip part of the electron source 20 constituting the electron emitting part but also from a side surface part of the electron source 20 formed into the cone shape. As a consequence, the electron beam in a desired amount and in a desired shape may be difficult to obtain, or the luminance of the electron beam generated from a central part may be reduced by occurrence of a space-charge effect due to the unnecessary electrons in the surrounding area. To avoid these problems, the area other than the electron emission part of the electron source 20 is covered with the material different from the material of the electron source 20. As for this different material, a substance having a larger work function than that of the material constituting the electron source 20 should be selected.

When using $LaB_6$ as the electron source 20, the use of carbon (C) is preferable because carbon does not react with $LaB_6$ and has a larger work function than that of $LaB_6$. Since the carbon reacts with oxygen, the carbon is forecasted to be evaporated and eventually disappear in the form of carbon dioxide ($CO_2$) in case that the carbon film is too thin. Accordingly, it is preferable to set the thickness of the carbon film in a range from 2 µm to 10 µm. Likewise, the carbon material is also suitable for the covering material in the case where $CeB_6$ is used as an electron source, as the $CeB_6$ has similar properties to $LaB_6$.

Figure 5B:
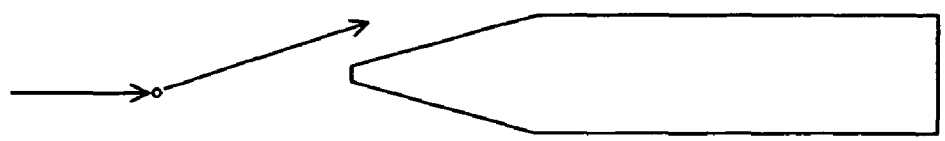
FIGS. 5A and 5B are cross-sectional diagrams showing shapes of a tip of the electron source.
Figure 5A:
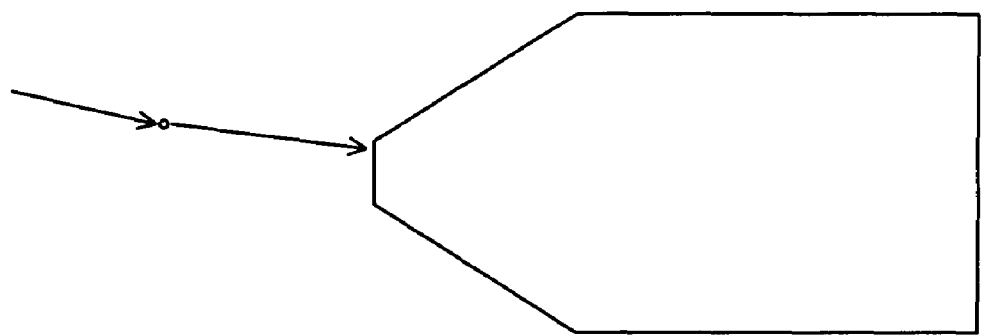

FIGS. 5A and 5B are cross-sectional diagrams showing examples of the electron source 20 that has different cone angles at the tip part thereof. In general, a smaller radius or a smaller angle at the tip of the cone-shaped electron source 20 causes stronger electric field concentration on the tip part, whereby the electrons inside the electron source 20 can break through a work function barrier on the surface more easily by a tunneling phenomenon. However, in case that the tip part is formed too thin, the electron source 20 loses its strength. Therefore, the tip angle of the electron source 20 is determined in consideration of the strength of the electron source 20 and the electric field intensity.

FIG. 5A shows a case of setting the cone angle at the tip part of the electron source 20 approximately equal to 90°. Meanwhile, FIG. 5B shows a case of reducing the cone angle at the tip part of the electron source 20 as compared to FIG. 5A. Conventionally, the cone angle at the tip part of the electron source 20 has been set approximately equal to 90° as shown in FIG. 5A. As the tip angle is reduced as shown in FIG. 5B, the higher electric field is easily obtained and the electrons is emitted easily. In addition, particulates such as ions existing inside a lens barrel collide with the tip part of the electron source less frequently. Therefore, the depletion and the deformation effects on the surface of the electron source attributable to ions and the like can be reduced.

In the embodiment of the present invention, the angle at the tip of the electron source 20 is set approximately equal to 30°. Although a product life depends on the material and sizes such as the length or the width of the electron source 20, the electron source 20 of the embodiment of the present invention can be used stably for a longer period than the conventional electron source.

(Exposure Method)

Next, an exposure method applying the exposure apparatus including the electron gun of the embodiment in the present invention will be described.

In general, the electron beam exposure apparatus carries out conditioning when starting operation in order to clean up an electron gun chamber (not shown) for housing the electron gun 101, the suppressor electrode 24, the extraction electrode 21, the electrostatic lens electrode 26, and the acceleration electrode 25. In this conditioning operation, a high voltage such as a voltage 1.6 times higher (80 kV) than a voltage during a usual operation (50 kV) is applied between the electrodes constituting the electron gun 101 (including the electron source 20, the suppressor electrode 24, the extraction electron 21, and the electrostatic lens electrode 26) and the acceleration electrode 25 to cause a discharge. In this way, dust inside the electron gun chamber is removed.

In the conditioning operation, in case that the extraction electrode 21 and the electrostatic lens electrode 26 are omitted or otherwise not provided such that the electron source 20 is configured to be directly opposed to the acceleration electrode 25, then the discharge maybe initiated from the electron beam 20. Such a discharge may cause melting or breakage of the electron source 20.

To avoid this problem, the extraction electrode 21 is provided and the electric potential at this extraction electrode is set lower than the electric potential at the electron source 20 so as to avoid extraction of the electrons from the electron source during the conditioning operation.

After a lapse of a predetermined period of time or upon completion of the conditioning operation for a period ranging from one to several tens of hours, for example, the electric potential at the extraction electrode 21 is set higher than the electric potential at the electron source 20 to establish a usual operating state.

As described above, since the electric potential at the extraction electrode 21 is set lower than the electric potential at the electron source 20 during the conditioning operation of applying the high voltage to the electrodes, the extraction of the electrons from the electron source 20 can be suppressed and thereby the electron source 20 is prevented from melting.
(Method of Forming Region for Restricting Electron Emission on Surface of Electron Source)

Next, a method of forming a region for restricting the above-described emission of the electrons on the electron source 20 will be described.

Here, the electron source having the structure shown in FIG. 5B will be used as an example. Moreover, single-crystal $LaB_6$ is assumed to be used for the electron source 20.

Firstly, the $LaB_6$ single crystal is processed to form the tip in the cone shape.

Next, the carbon 30 is coated on the surface of the $LaB_6$ single crystal in order to form the region for restricting emission of the electrons. For the coating operation, any methods among a CVD (chemical vapor deposition) method, a vacuum evaporation method, a sputtering method, and so forth may be applicable. In this case, the coated film only needs to have a sufficient thickness for adequately changing the work function on the surface of the electron emission surface (changing the work function larger than that of $LaB_6$) and for preventing evaporation of the $LaB_6$ material. When using carbon, the thickness of carbon is preferably set in the range from 2 µm to 10 µm taking into consideration that carbon reacts with oxygen and then evaporates in the form of $CO_2$.

Next, the tip of the electron source 20 is polished together with the coated film so as to form the planarized surface having the diameter in the range from 1 µm to 200 µm.
(Effects)

As described above, according to the embodiment in the present invention, only the tip of a chip of the electron source 20 is exposed and the remaining side surface part thereof is covered with the different material. When using $LaB_6$ as the material of the electron source 20, for example, carbon is used as the different material.

In the embodiment in the present invention, the chip hardly sublimates because the electron gun is operated at a low temperature. Accordingly, the electron gun 101 can be used stably for a long period of time while avoiding deformation of the electron emission surface 20a of the electron source 20. Moreover, since the side surface of the electron source 20 is covered with the carbon 30, no electrons are emitted from the side surface of the electron source 20 even when the intense electric field is applied thereto. In this way, the deformation of the shape of the electron beam can be prevented and the phenomenon of degradation in vacuum due to an increase in the temperature in an unnecessary position is avoided thereby.

Further, the surface of $LaB_6$ is virtually exposed only on the central part at the tip of the electron gun. Therefore, the attachment of $LaB_6$ on an inner surface of a Wehnelt cylinder as observed in the conventional technology, which is attributable to a large area of exposure of $LaB_6$ including side wall parts and a rear surface, can be prevented.

By using the electron gun 101 of the embodiment in the present invention, the sublimation of the electron source 20 can be suppressed and the attachment of the material constituting the electron source 20, such as $LaB_6$ or $CeB_6$, on a rear surface of a grid can be prevented. In case such a material is attached to the rear surface of the grid, the attached material may form a whisker, charge the electrons thereon, and cause a micro discharge. In that case, the micro discharge may cause instabilities of the electron beam quantity and of a radiating position in the use of the electron beam exposure apparatus. Accordingly, even in case the deformation of the electron source 20 of the electron gun 101 is nominal, such a micro discharge makes stable operation of the electron beam exposure apparatus difficult.

In the case of a conventional electron gun, such a micro discharge has been deemed to emerge 100 hours to 500 hours after starting to use the electron gun. In contrast, as described above, the electron source 20 hardly sublimates when using the electron gun 101 of the embodiment in the present invention. Therefore, the interval of time until the micro discharge emerges can be extended almost as one hundred times as long as the conventional technology. This is because the electron gun of the embodiment in the present invention is used at the temperature which is lower by 200° C than the conventional technology so that the degree of sublimation of the electron source is reduced to 1/100. In this way, the period for stable use of the electron beam exposure apparatus is accomplished.

Moreover, in the case of a multicolumn electron beam exposure apparatus configured to expose on a single wafer, by the use of multiple electron guns 101, the period of stable use is dramatically extended compared to the conventional technology, by applying the electron guns 101 of the embodiment in the present invention. In the use of the conventional electron guns, the adjustment in short cycles after the use should be performed because micro discharges will occur within 100 to 500 hours as described above. Therefore, even when using the multiple electron guns, the entire apparatus must be stopped once when any of the electron guns becomes unstable, thereby leading to a drop in the operation rate and incapability of enhancing the throughput. On the other hand, such a drop in the operation rate is avoided and thereby the throughput of exposure processes is enhanced virtually by applying the electron guns of the embodiment in the present invention to the multicolumn electron beam exposure apparatus.

In the above-described embodiment, the tip of the electron gun 101 is planarized, and the electron emission surface 20a and the different material for covering the side surface of the electron source 20 are formed to be on the same plane. This structure is applied to the embodiment in the present invention as the heat applied to the electron source 20 is low enough to avoid sublimation of the material constituting the electron source 20 regarding that the electron source 20 would not be deformed by emission of the electron beam.

Figure 6:
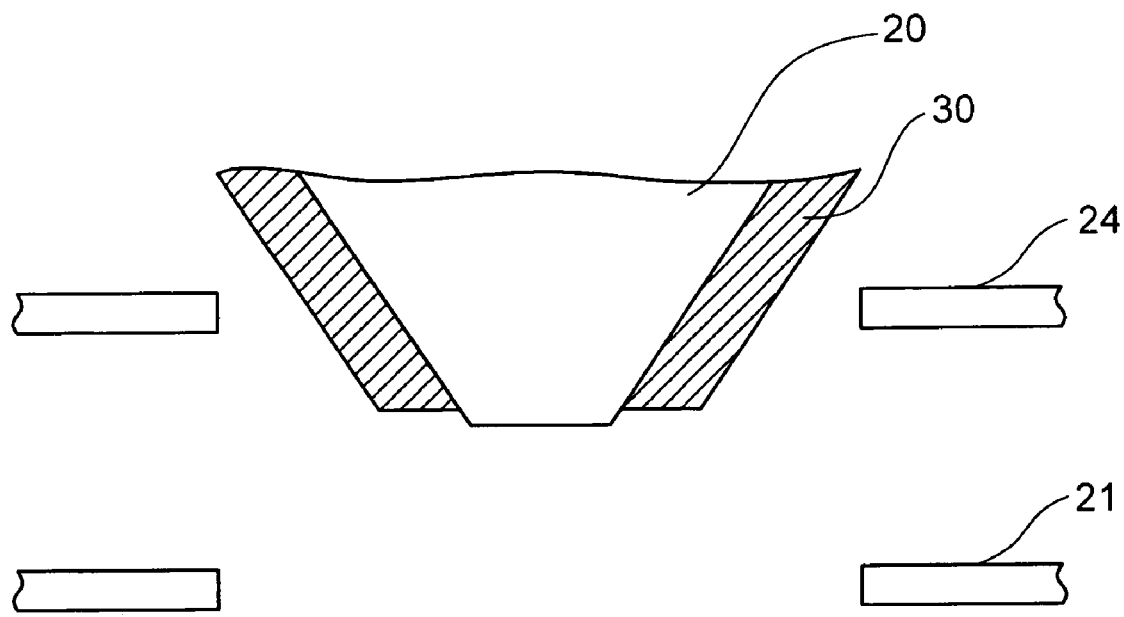
FIG. 6 is a block diagram of an electron source and electrodes according to another embodiment of the electron gun shown in FIG. 2.

However, even when the heat reduced to a predetermined temperature sufficient for avoiding sublimation is applied, the temperature may still exceed the predetermined temperature for any reason. In such a case, maintaining the planarized surface may be difficult due to actual depletion of the material of the electron source in excess of the forecast, and eventually, the central part of the planarized surface may gradually subside with time. In consideration of this problem, the tip including the electron emission surface 20*a* can be formed so as to protrude from the planarized surface of the different material as shown in FIG. 6 instead of forming the electron emission surface 20*a* of the electron source 20 and the surface of the surrounding different material on the same plane.

Figure 7:
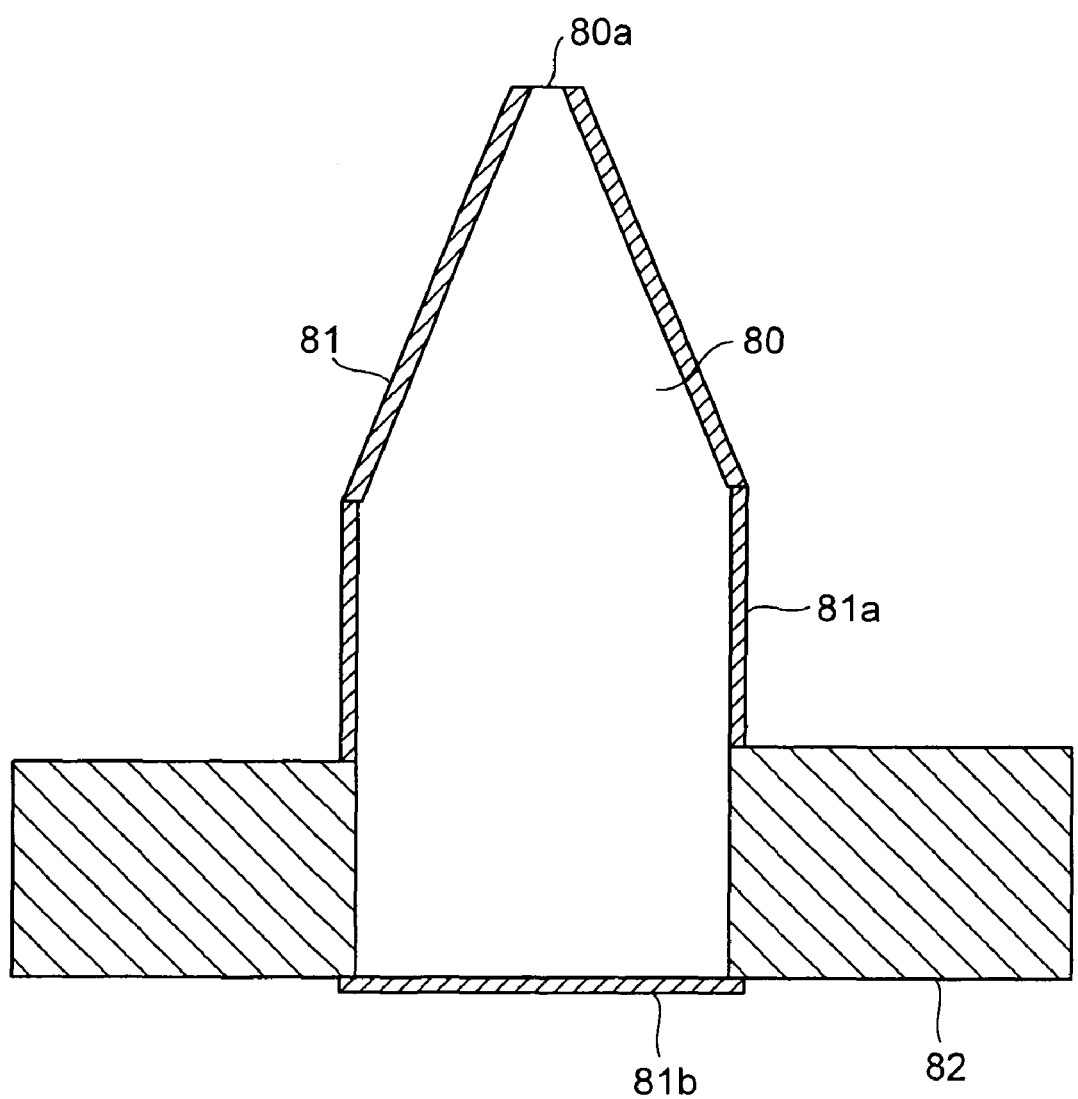
FIG. 7 is a cross-sectional diagram of the electron source for explaining a region for restricting emission of electrons.

Moreover, in the embodiment in the present invention, the side surface of the electron source is described as the region for restricting emission of the electrons. Instead, as shown in FIG. 7, the following parts can be covered with the different material: a rear surface 81*b* and a side surfaces (81 and 81*a*) of an electron source 80 excluding an electron emission surface 80*a* and a part sandwiched by a carbon chip 82 to be energized for heating. In this way, sublimation of the electron source 80 can be reduced and an amount of attached materials to the Wehnelt cylinder and other components can be reduced as well.

What is claimed is:

1. An electron gun comprising:
an electron source for emitting electrons, the electron source having an electron emission region configured to emit the electrons and an electron emission restrictive region configured to restrict emission of the electrons, wherein
the electron emission restrictive region is a side surface of the electron source except a tip of the electron source for the electron emission, and is covered with a different material from the electron source, and
thermal field-emitted electrons are emitted through application of an electric field to the tip with a sufficiently low temperature being maintained to avoid sublimation of a material of the electron source.

2. The electron gun according to claim 1, wherein the material of the electron source is any one of lanthanum hexaboride ($LaB_6$) and cerium hexaboride ($CeB_6$).

3. The electron gun according to claim 1, wherein the electron emission restrictive region is covered with carbon.

4. The electron gun according to claim 1, wherein the temperature is set in a range from 1100° C. to 1300° C.

5. The electron gun according to claim 1, wherein the tip comprises a planarized part having a diameter in a range from 1 μm to 200 μm.

6. The electron gun according to claim 1, wherein the tip of the electron source is formed into a substantially cone shape, and has a cone angle equal to or below 50 degrees.

7. The electron gun according to claim 1, wherein the electron emission restrictive region is defined as a region including the side surface and a rear surface of the electron source except the electron emission surface and a part sandwiched by a carbon chip used for heating by energization.

8. An electron beam exposure apparatus comprising:
the electron gun configured by elements according to claim 1.

9. An electron gun comprising:
an electron source configured to emit electrons;
an extraction electrode located at a given distance away from an electron emission surface of the electron source and configured to extract the electrons;
a suppressor electrode located above the extraction electrode and the electron emission surface and configured to suppress emission of the electrons from a side surface of the electron source; and
an acceleration electrode located below the extraction electrode and configured to accelerate the electrons,
wherein the side surface of the electron source except the electron emission surface on a tip of the electron source is covered with a different material from the electron source, and
thermal field-emitted electrons are emitted through application of an electric field to the tip with a sufficiently low temperature being maintained to avoid sublimation of a material of the electron source.

10. The electron gun according to claim 9, wherein the material of the electron source is any one of lanthanum hexaboride ($LaB_6$) and cerium hexaboride ($CeB_6$).

11. The electron gun according to claim 9, wherein the different material is carbon.

12. The electron gun according to claim 9, wherein the temperature is set in a range from 1100° C. to 1300° C.

13. The electron gun according to claim 9, wherein the extraction electrode is located at a distance equal to or below 2 mm away from the electron emission surface.

14. The electron gun according to claim 9, wherein an electrostatic lens electrode is located between the extraction electrode and the acceleration electrode.

15. An electron beam exposure apparatus comprising:
the electron gun configured by elements according to claim 9.

16. An exposure method applying an electron gun provided with an electron source configured to emit electrons, an extraction electrode located at a given distance away from an electron emission surface of the electron source and configured to extract the electrons, a suppressor electrode located above the extraction electrode and the electron emission surface and configured to suppress emission of the electrons from a side surface of the electron source, and an acceleration electrode located below the extraction electrode and configured to accelerate the electrons, the electron gun being configured to emit thermal field-emitted electrons by applying an electric field to a tip of the electron source while maintaining a sufficiently low temperature to avoid sublimation of a material of the electron source, and then to render a sample exposed to the thermal field-emitted electrons, the method comprising the steps of:
applying a voltage for a given time period so as to render electric potential at the extraction electrode lower than electric potential at the tip of the electron source; and
performing exposure by applying the voltage so as to render the electric potential at the extraction electrode higher than electric potential at the tip of the electron source.

* * * * *